(12) United States Patent
Lin et al.

(10) Patent No.: US 7,491,421 B2
(45) Date of Patent: Feb. 17, 2009

(54) GRAPHITE BASE FOR HEAT SINK, METHOD OF MAKING GRAPHITE BASE AND HEAT SINK

(75) Inventors: Kai-Yu Lin, P.O. Box 108-00403, Taipei (TW) 106; Yi-Ning Chung, P.O. Box 108-00403, Taipei (TW) 106

(73) Assignees: Kai-Yu Lin, Taipei Hsien (TW); Yi-Ning Chung, Taipei (TW)

( * ) Notice: Subject to any disclaimer, the term of this patent is extended or adjusted under 35 U.S.C. 154(b) by 735 days.

(21) Appl. No.: 10/907,711

(22) Filed: Apr. 13, 2005

(65) Prior Publication Data

US 2006/0230615 A1    Oct. 19, 2006

(51) Int. Cl.
| C23C 16/00 | (2006.01) |
| B05D 1/18 | (2006.01) |
| B29C 65/00 | (2006.01) |
| B31B 1/60 | (2006.01) |
| B32B 37/00 | (2006.01) |

(52) U.S. Cl. ................. 427/250; 427/430.1; 427/434.5; 156/60

(58) Field of Classification Search ................. None
See application file for complete search history.

(56) References Cited

U.S. PATENT DOCUMENTS

| 3,719,608 A | * | 3/1973 | Olstowski | 252/506 |
| 4,512,858 A | * | 4/1985 | Struck et al. | 205/554 |
| 4,929,404 A | * | 5/1990 | Takahashi et al. | 264/29.5 |

* cited by examiner

Primary Examiner—Timothy Meeks
Assistant Examiner—Kelly M Stouffer

(57) ABSTRACT

A graphite base is made by: mixing nanometered graphite powder with a bonding agent to form a graphite mixture and then grinding the graphite mixture and processing the graphite mixture into a graphite mass with a high pressure by means of hot press, cold press and vibration, and then dipping the graphite mass in a liquid phase asphalt, and then baking the graphite mass to a dry state graphite block. The dry state graphite block is further coated with a layer of metal coating and bonded with metal radiation fins to form a heat sink.

8 Claims, 5 Drawing Sheets

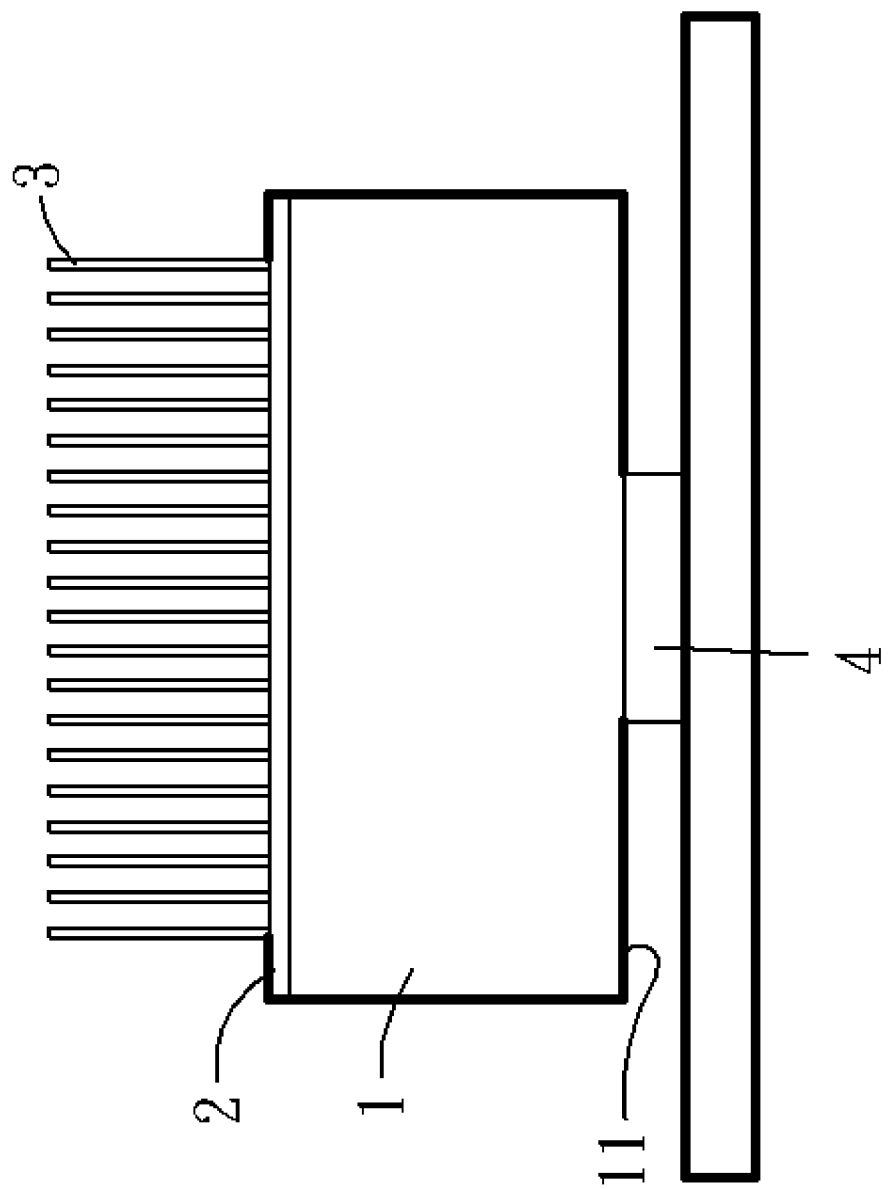

GRAPHITE BASE FOR HEAT SINK, METHOD OF MAKING GRAPHITE BASE AND HEAT SINK

BACKGROUND OF THE INVENTION

1. Field of the Invention

The present invention relates to a graphite base for heat sink and more particularly, to a method of making a graphite base by means of processing a graphite mixture of nanometered graphite and asphalt mixture into a graphite mass with a high pressure by means of hot press, cold press and vibration, and then dipping the graphite mass in a liquid phase asphalt, and then baking the graphite mass into a dry state graphite block.

2. Description of the Related Art

Following fast development of high technology, electronic devices are made in a mini scale, and element density in a unit area is relatively increased to enhance the working efficiency. An active electronic device produces much heat during operation. If heat is not quickly dissipated during the operation of an active electronic device, the electronic device will become unstable due to thermal stress or electron ionization. Therefore, it is important to prevent overheat of an electronic device during operation.

Because it is the market trend of semiconductor and electronic package toward high power and high density, heat dissipation problem will become more and more serious. For dissipating heat from electronic devices of high power density, pure copper is commonly used for making heat spreaders or heat pipes. However, copper heat spreaders and heat pipes are expensive. Further, the heat conductivity of copper and aluminum are about 400 W/mk and 200 W/mk respectively. These heat conductivities are not enough to dissipate heat from high-density power electronic devices efficiently. Further, copper and aluminum have a high density (about 8.5 g/cc and 2.7 g/cc respectively). A copper or aluminum heat sink has a certain weight, which gives a high pressure to the electronic device to which the heat sink is attached, such high pressure may damage the surface of the electronic device.

Because copper and aluminum-based heat sinks have the aforesaid drawbacks, new heat dissipation materials are desired. Further, carbon is an abundant natural substance in the world. When graphitized, carbon becomes a good electric and heat conductor. Natural graphite is a soft black material (see FIGS. 1 and 2). When natural graphite is rolled into a roll of thin sheet material, it has a high in-plane conductivity (about 240 W/M-K~600 W/M-K), however its thru-thickness conductivity is still low (about 6 W/M). Therefore, graphite is commonly prepared in the form of a roll of thin sheet material but not made in the form of a block for application. Increasing the heat conductivity of graphite in vertical direction while maintaining its heat conductivity in horizontal direction is the key to the application of graphite in dissipation of heat.

SUMMARY OF THE INVENTION

The present invention has been accomplished under the circumstances in view. According to one aspect of the present invention, a graphite mixture of nanometered graphite and asphalt mixture is processed into a graphite mass with a high pressure by means of hot press, cold press and vibration, and then the graphite mass is dipped in a liquid phase asphalt to fill up crevices, and then the graphite mass is baked to a dry state graphite block. According to another aspect of the present invention, the top surface of the dry state graphite block is coated with a layer of metal coating for the bonding of metal radiation fins to form a heat sink. A heat sink made according to the present invention can efficiently quickly dissipate heat from the electronic device to which it is attached, preventing unstable status of the electronic device due to thermal stress or electron ionization. Further, the graphite base of the heat sink has less weight that gives not much pressure to the electronic device, preventing damage to the surface of the electronic device.

BRIEF DESCRIPTION OF THE DRAWINGS

FIG. 7 is an applied view of a graphite-based heat sink constructed according to the present invention.

DETAILED DESCRIPTION OF THE PREFERRED EMBODIMENT

Figure 1:
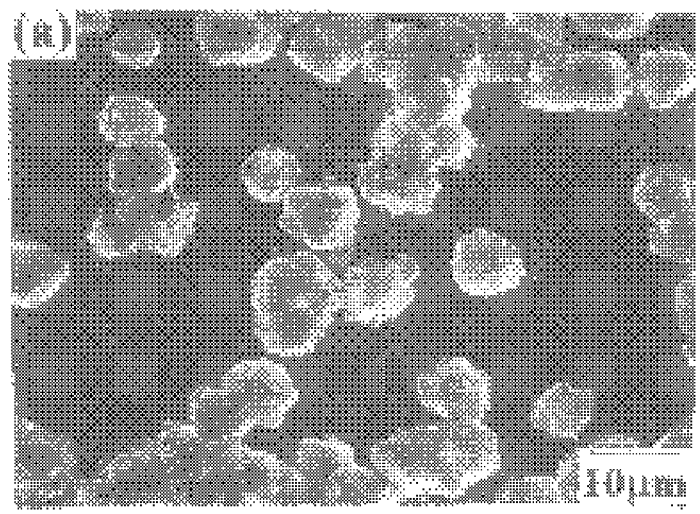
FIG. 1 is a microscope view of natural graphite (I).
Figure 2:
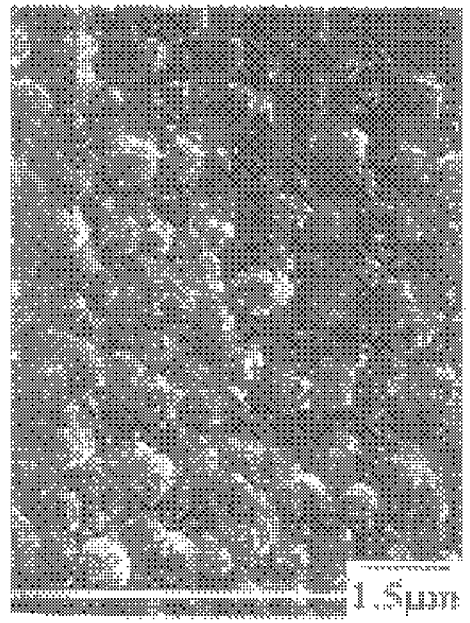
FIG. 2 is a microscope view of natural graphite (II).
Figure 3:
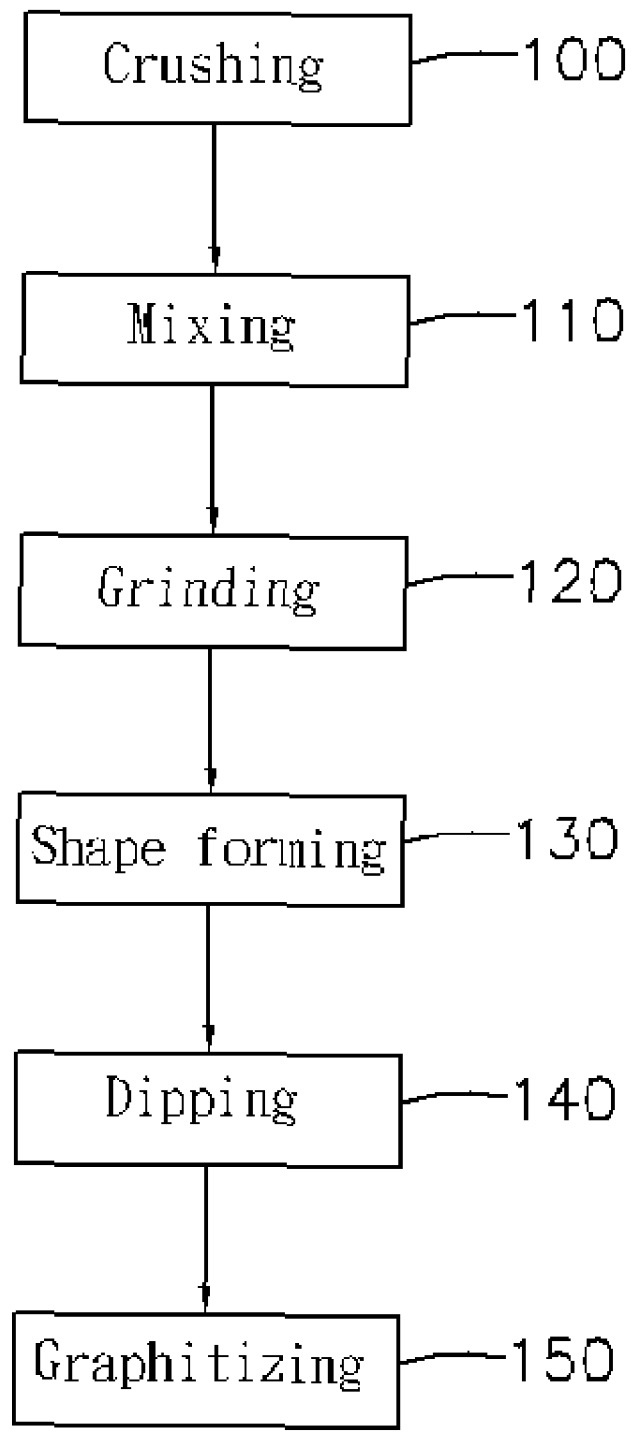
FIG. 3 is a graphite base manufacturing flow chart according to the present invention.
Figure 4:
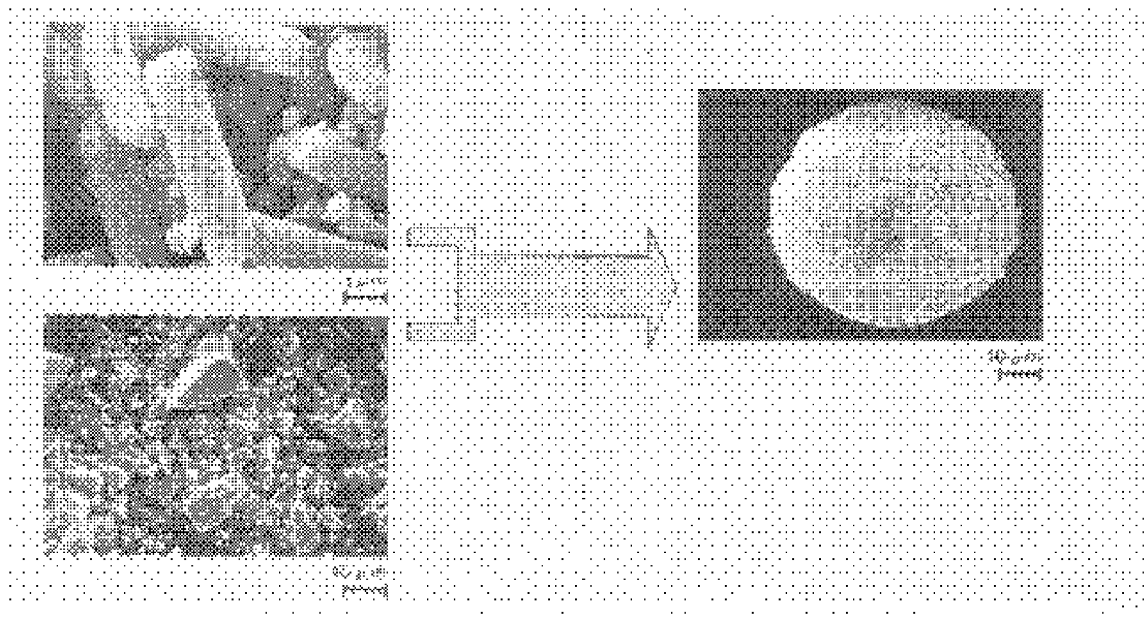
FIG. 4 is a schematic drawing showing ball-like graphite according to the present invention.

Referring to FIG. 3, a graphite base manufacturing method in accordance with the present invention comprises the steps of: (100) Crushing, where natural graphite is crushed into nanometered graphite powder; (110) Mixing, where nanometered graphite powder thus obtained is mixed with a bonding agent, for example, asphalt or mesophase asphalt into a graphite mixture; (120) Grinding, where the graphite mixture is grinded to evenly spread graphite powder so as to obtain ball-like graphite (see FIG. 4); (130) Shape forming, where the ball-like graphite thus obtained is processed into a graphite mass with a high pressure by means of hot press, cold press and vibration; (140) Dipping, where the graphite mass thus obtained is dipped in a liquid phase asphalt, enabling the liquid phase asphalt to fill up crevices in the graphite mass; and (150) Graphitizing, where the graphite mass is baked at 320° intermittently for one month, and a high thru-thickness heat conductive graphite is thus obtain.

Figure 5:
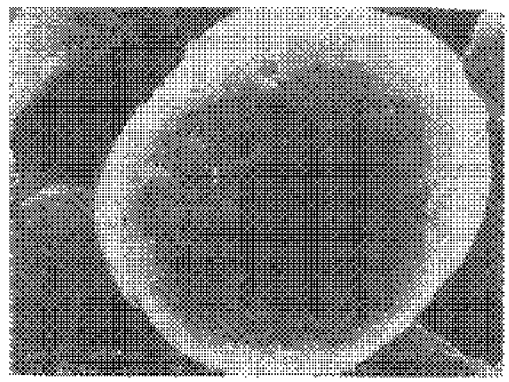
FIG. 5 is a microscope view of a graphite block made according to the present invention (I).
Figure 6:
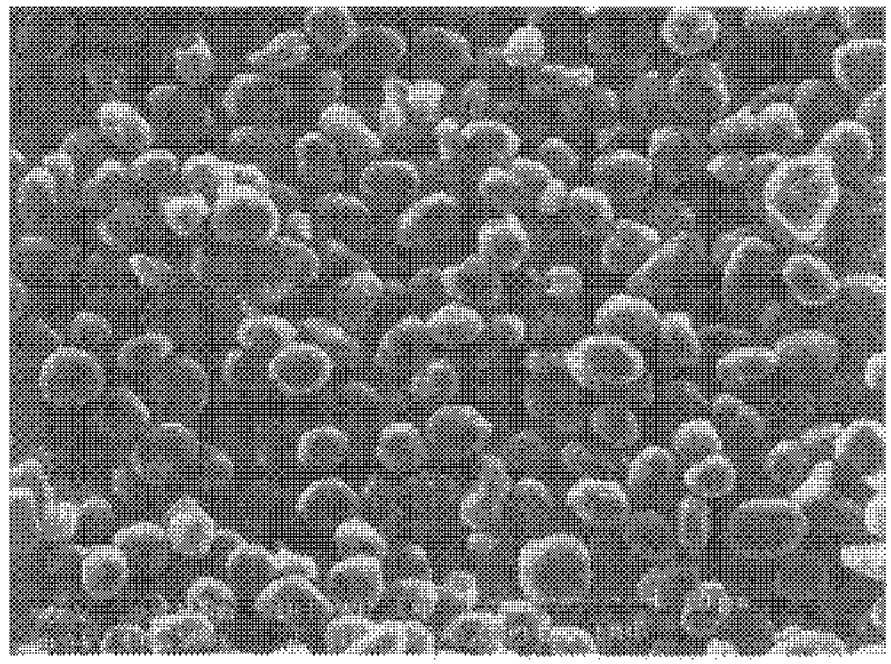
FIG. 6 is a microscope view of a graphite block made according to the present invention (II).

The finished block-like graphite thus obtained has a very high density (see FIGS. 5 and 6). The thru-thickness heat conductivity of the finished block-like graphite is about 910 W/M-K. The density of the finished block-like graphite is about 1.2 g/cc~2.2 g/cc.

FIG. 7 shows a heat sink fastened to an electronic device for dissipating heat from the electronic device. The heat sink comprises a graphite base 1, which is obtained from the aforesaid graphite manufacturing process and has the bottom surface 11 attached to an electronic device 4, a metal coating 2 covered on the top surface of the graphite base 1, and a plurality of metal radiation fins 3 soldered to the metal coating 2 at the top side of the graphite base 1. During working of the electronic device 4, the graphite base 1 absorbs heat from the electronic device 4, enabling heat to be quickly dissipating into the air through the metal coating 2 and the metal radiation fins 3, preventing unstable status of the electronic device 4 due to thermal stress or electron ionization. Because the density of the graphite base 1 of the heat sink is low, the total weight of the heat sink is low. When installed, the heat sink gives not much pressure to the electronic device 4, preventing damage to the surface of the electronic device 4.

Further, the metal coating 2 at the graphite base 1 can be obtained from copper, nickel, or their alloy by means of electroplating or vacuum evaporation.

As indicated above, the invention has the following features.

(1) The invention has graphite be nanometered and mixed with asphalt and then processed into ball-like graphite, which is then processed into a graphite block with a high pressure by means of hot press, cold press and vibration, and then dipped in a liquid phase asphalt for enabling the liquid phase asphalt to fill up crevices in the graphite block, and then baked to form a high thru-thickness heat conductive graphite.

(2) The high thru-thickness heat conductive graphite is used as a base, which is coated with a layer of metal coating to form a graphite base for heat sink. A heat sink using a graphite base according to the present invention can efficiently quickly dissipate heat from the electronic device to which it is attached, preventing unstable status of the electronic device due to thermal stress or electron ionization. Further, the graphite base has less weight that gives not much pressure to the electronic device, preventing damage to the surface of the electronic device.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A graphite base manufacturing method comprising the steps of:
    (a) grinding natural graphite into nanometered graphite powder;
    (b) mixing said nanometered graphite powder with a bonding agent to form a graphite mixture;
    (c) grinding said graphite mixture into ball-like graphite;
    (d) processing said ball-like graphite into a graphite mass with a high pressure by means of hot press, cold press or vibration;
    (e) dipping said graphite mass in a liquid phase asphalt, enabling said liquid phase asphalt to fill up crevices in said graphite mass;
    (f) graphitizing said graphite mass to a dry state graphite block; and
    (g) covering a top surface of said dry state graphite block with a layer of metal coating to form a graphite base.

2. The graphite base manufacturing method as claimed in claim 1, wherein said bonding agent is selected from one of an asphalt group consisting of natural asphalt and mesophase asphalt.

3. The graphite base manufacturing method as claimed in claim 1, wherein said graphite mass is baked to a dry status at 320° intermittently for one month.

4. The graphite base manufacturing method as claimed in claim 1, where said dry state graphite block has a thru-thickness heat conductivity of about 910 W/M-K.

5. The graphite base manufacturing method as claimed in claim 1, wherein said dry state graphite block has a density of about 1.2 g/cc~2.2 g/cc.

6. A heat sink manufacturing method comprising the steps of:
    (a) grinding natural graphite into nanometered graphite powder;
    (b) mixing said nanometered graphite powder with a bonding agent to form a graphite mixture;
    (c) grinding said graphite mixture into ball-like graphite;
    (d) processing said ball-like graphite into a graphite mass with a high pressure by means of hot press, cold press or vibration;
    (e) dipping said graphite mass in a liquid phase asphalt, enabling said liquid phase asphalt to fill up crevices in said graphite mass;
    (f) graphitizing said graphite mass to a dry state graphite block;
    (g) covering a top surface of said dry state graphite block with a layer of metal coating to form a graphite base; and
    (h) bonding metal radiation fins to said metal coating.

7. The heat sink manufacturing method as claimed in claim 6, wherein said metal coating is selected from one of a metal group consisting of copper, nickel, copper alloy, and nickel alloy.

8. The heat sink manufacturing method as claimed in claim 6, wherein said metal coating is covered on said dry state graphite block by means of one of a series of coating methods including electroplating and vacuum evaporation.

* * * * *